(12) United States Patent
Hong et al.

(10) Patent No.: US 10,854,700 B2
(45) Date of Patent: Dec. 1, 2020

(54) ORGANIC LIGHT EMITTING DIODE DISPLAY INCLUDING REACTION BLOCKING MEMBER ON COMMON VOLTAGE LINE

(71) Applicant: Samsung Display Co., Ltd., Yongin (KR)

(72) Inventors: Sang-Mok Hong, Yongin (KR); Gun-Tae Park, Yongin (KR); Ho-In Lee, Yongin (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 0 days.

(21) Appl. No.: 16/202,169

(22) Filed: Nov. 28, 2018

(65) Prior Publication Data

US 2019/0096982 A1    Mar. 28, 2019

Related U.S. Application Data

(62) Division of application No. 15/450,140, filed on Mar. 6, 2017, now Pat. No. 10,170,531, which is a division of application No. 14/106,784, filed on Dec. 15, 2013, now Pat. No. 9,627,642.

(30) Foreign Application Priority Data

Jul. 22, 2013  (KR) .......................... 10-2013-0086234

(51) Int. Cl.
*H01L 51/52*    (2006.01)
*H01L 27/32*    (2006.01)

(52) U.S. Cl.
CPC ...... *H01L 27/3276* (2013.01); *H01L 51/5203* (2013.01); *H01L 51/5221* (2013.01); *H01L 51/5253* (2013.01)

(58) Field of Classification Search
CPC ............. H01L 27/3276; H01L 51/5203; H01L 51/5221; H01L 51/5253
USPC ....................................... 257/40; 438/82, 99
See application file for complete search history.

(56) References Cited

U.S. PATENT DOCUMENTS

| 8,241,933 | B2 | 8/2012 | Lee et al. |
| 2004/0245923 | A1 | 12/2004 | Park et al. |
| 2005/0116232 | A1* | 6/2005 | Kim ................... H01L 27/124 257/72 |
| 2006/0118788 | A1 | 6/2006 | Park |
| 2007/0111090 | A1 | 5/2007 | Cardenas-Valencia et al. |
| 2008/0012474 | A1 | 1/2008 | Sung et al. |
| 2009/0021664 | A1 | 1/2009 | Yamazaki |

(Continued)

FOREIGN PATENT DOCUMENTS

| KR | 1020060053463 A | 5/2006 |
| KR | 100722118 B1 | 5/2007 |

(Continued)

*Primary Examiner* — Didarul A Mazumder
(74) *Attorney, Agent, or Firm* — Cantor Colburn LLP

(57) ABSTRACT

An organic light emitting diode ("OLED") display includes: a substrate divided into a pixel area, and a peripheral area enclosing the pixel area; an OLED in the pixel area and including a first electrode, an organic emission layer and a second electrode; a common voltage line in the peripheral area and transmitting a common voltage to the second electrode; and a reaction blocking part overlapping the common voltage line.

4 Claims, 7 Drawing Sheets

(56) References Cited

U.S. PATENT DOCUMENTS

| | | | |
|---|---|---|---|
| 2010/0072482 A1* | 3/2010 | Eom | H01L 27/3276 257/72 |
| 2011/0133215 A1* | 6/2011 | Kang | H01L 27/3279 257/88 |
| 2011/0140114 A1* | 6/2011 | Ko | H01L 27/3244 257/59 |
| 2012/0146487 A1* | 6/2012 | Kim | H01L 27/3276 313/504 |
| 2012/0256973 A1* | 10/2012 | Choi | H01L 51/5253 345/690 |
| 2012/0273817 A1 | 11/2012 | Hatta et al. | |
| 2013/0077008 A1 | 3/2013 | Kim et al. | |

FOREIGN PATENT DOCUMENTS

| | | |
|---|---|---|
| KR | 1020100090998 A | 8/2010 |
| KR | 1020120011318 A | 2/2012 |
| KR | 1020130024090 A | 3/2013 |

* cited by examiner

ORGANIC LIGHT EMITTING DIODE DISPLAY INCLUDING REACTION BLOCKING MEMBER ON COMMON VOLTAGE LINE

This application is a divisional application of U.S. application Ser. No. 15/450,140 filed Mar. 6, 2017, which is a divisional application of U.S. application Ser. No. 14/106,784 filed Dec. 15, 2013 and issued as U.S. Pat. No. 9,627,642 on Apr. 18, 2017, which claims priority to Korean Patent Application No. 10-2013-0086234 filed on Jul. 22, 2013, and all the benefits accruing therefrom under 35 U.S.C. § 119, the entire contents of which are incorporated herein by reference.

BACKGROUND

(a) Field

The invention relates to an organic light emitting diode ("OLED") display.

(b) Description of the Related Art

An OLED display includes a substrate providing a pixel area and a peripheral area, and a thin film encapsulation ("TFE") layer encapsulating the substrate by alternately depositing an organic layer and an inorganic layer for encapsulation.

In the pixel area, a plurality of organic light emitting diodes ("OLEDs") connected between a scan line and a data line arranged in a matrix is disposed to form one or more pixel. The OLED includes an anode, a cathode, and an organic emission layer between the anode and the cathode. In the peripheral area, a scan end and a data end extended from the scan line and the data line of the pixel area, respectively, a power supply line for operation of the OLED, and a scan driver and a data driver processing and supplying signals provided from the outside to the scan end and the data end, are provided.

SUMMARY

The invention provides an organic light emitting diode ("OLED") display that prevents a galvanic reaction of materials of a common voltage line and a pixel electrode in an etching process of the pixel electrode, by blocking the materials of the common voltage line and the pixel electrode from each other.

An OLED display according to an exemplary embodiment of the invention includes: a substrate divided into a pixel area, and a peripheral area enclosing the pixel area; an OLED which is in the pixel area and includes a first electrode, an organic emission layer and a second electrode; a common voltage line which is in the peripheral area and transmits a common voltage to the second electrode; and a reaction blocking part which is in the peripheral area and overlaps the common voltage line.

A scan line which is in the pixel area and transmits a scan signal, a data line which intersects the scan line and transmits a data signal, and a protective layer which covers the data line may be further included. The common voltage line may be in a same layer and include a same material as the data line, and a portion of the common voltage line may be exposed by the protective layer.

The reaction blocking part may include a same material as the first electrode.

The reaction blocking part may overlap a side surface and a portion of an upper surface of the common voltage line.

The second electrode may contact another portion of the upper surface of the common voltage line and be on the other portion of the upper surface of the common voltage line.

The reaction blocking part may cover an entirety of the upper surface and the side surface of the common voltage line.

The second electrode may contact the reaction blocking part and be on an upper surface of the reaction blocking part.

The reaction blocking part may be a portion of the protective layer in the peripheral area, and overlap a side surface and a portion of an upper surface of the common voltage line.

A common connection member which is on the common voltage line may be further included, and the common connection member may connect the common voltage line and the second electrode to each other.

The common connection member may include a same material as the first electrode.

The common voltage line and the first electrode may include materials causing a galvanic reaction in cooperation with an electrolyte.

The common voltage line may include a main wire layer, and assistance wire layers respectively covering an upper side and a lower side of the main wire layer, and the main wire layer and the first electrode may include materials causing the galvanic reaction in cooperation with the electrolyte.

One or more exemplary embodiment of the OLED display according to the invention includes the reaction blocking part preventing exposure of a main layer of the common voltage line in the peripheral area to the outside such that main material layers of the common voltage line and the pixel electrode are blocked from each other in an etching process of the pixel electrode, thereby reducing or effectively preventing the galvanic reaction.

Accordingly, corrosion of the pixel electrode may be reduced or effectively prevented such that the dark point defect of the pixel of the OLED may be prevented.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1:
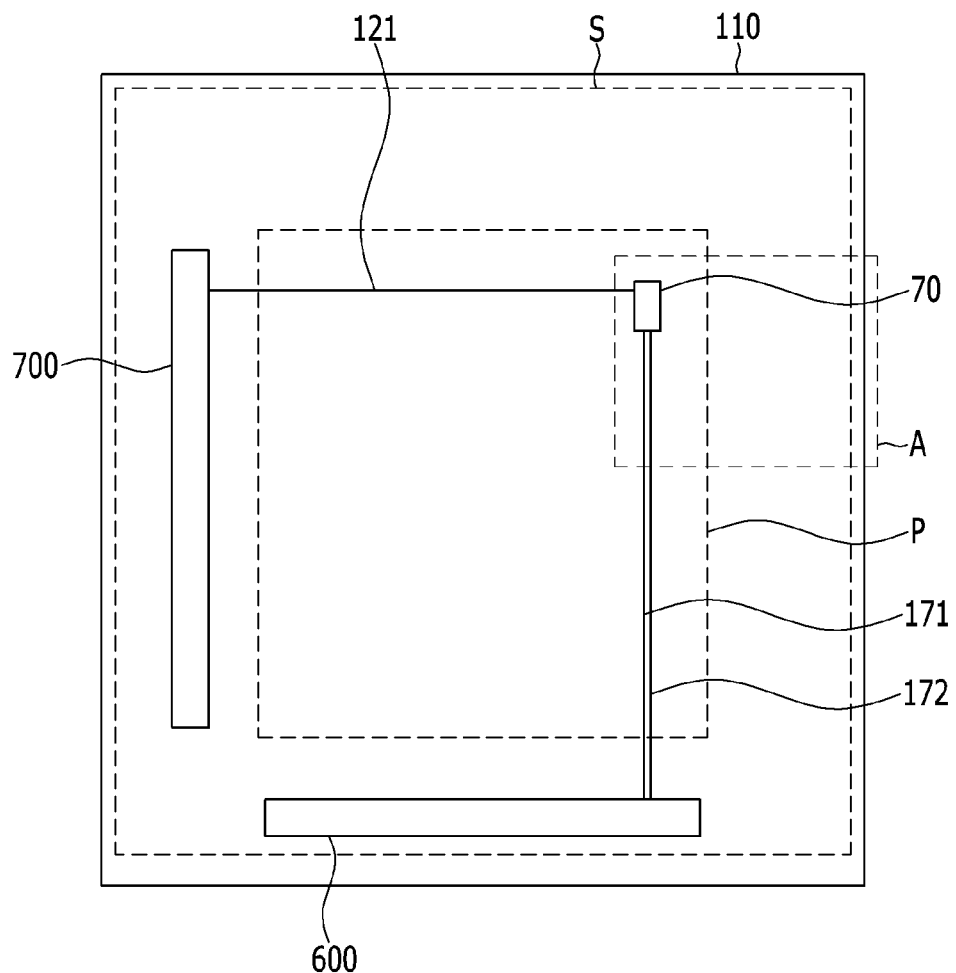
FIG. 1 is a top plan view of a pixel area and a peripheral area of an exemplary embodiment of an organic light emitting diode ("OLED") display according to the invention.

The invention will be described more fully hereinafter with reference to the accompanying drawings, in which exemplary embodiments of the invention are shown. As those skilled in the art would realize, the described embodiments may be modified in various different ways, all without departing from the spirit or scope of the invention.

The drawings and description are to be regarded as illustrative in nature and not restrictive. Like reference numerals designate like elements throughout the specification.

Further, in the drawings, a size and thickness of each element are randomly represented for better understanding and ease of description, and the invention is not limited thereto.

In the drawings, the thickness of layers, films, panels, regions, etc., are exaggerated for clarity. In addition, in order to clarify some layers and some regions, thicknesses and sizes thereof are enlarged in the drawings. It will be understood that when an element such as a layer, film, region, or substrate is referred to as being "on" another element, it can be directly on the other element or intervening elements may also be present.

The terminology used herein is for the purpose of describing particular embodiments only and is not intended to be limiting of the invention. As used herein, the singular forms "a," "an" and "the" are intended to include the plural forms as well, unless the context clearly indicates otherwise. In addition, unless explicitly described to the contrary, the word "comprise" and variations such as "comprises" or "comprising" will be understood to imply the inclusion of stated elements but not the exclusion of any other elements. Throughout this specification, it is understood that the term "on" and similar terms are used generally and are not necessarily related to a gravitational reference. As used herein, connected may refer to elements being physically and/or electrically connected to each other. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

Further, in the specification, the phrase "on a flat surface" means when an object portion is viewed from the above, and the phrase "on a cross-section" means when a cross-section taken by vertically cutting an object portion is viewed from the side.

Spatially relative terms, such as "lower," "upper" and the like, may be used herein for ease of description to describe the relationship of one element or feature to another element (s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" relative to other elements or features would then be oriented "above" relative to the other elements or features. Thus, the exemplary term "lower" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

A common voltage line disposed in the peripheral area of a display device includes a same material as a data line in a display (or pixel) area of the display device. The common voltage line may include a material that generates a galvanic reaction in cooperation with another material and an electrolyte. A protective layer is disposed on the common voltage line, and a pixel electrode is disposed on the protective layer. The pixel electrode may include a material such as silver (Ag), such that the galvanic reaction occurs relative to the material of the data line and in cooperation with an electrolyte. An outermost common voltage line, such as one disposed in the peripheral area, is not completely covered by the protective layer and is partially exposed.

When forming the pixel electrode such as by performing an etching process, the pixel electrode of a region adjacent to the exposed common voltage line may generate the galvanic reaction with the common voltage line due to an etchant such as an electrolyte. The galvanic reaction means a phenomenon in which corrosion is generated by an oxidation/reduction reaction when two metals having different standard reduction potentials are connected by the electrolyte. The galvanic reaction is generated when a large difference in standard reduction potential between the materials for the pixel electrode, and the data line and the common voltage line is present, thereby generating corrosion. For example, when the data line includes aluminum (Al) and the pixel electrode includes silver (Ag), because there is a large difference between the standard reduction potentials of aluminum and silver, the galvanic reaction is generated, and the corrosion may be generated when these two materials are connected to each other by the electrolyte. Therefore, the common voltage line may be over-etched by the galvanic reaction, and the over-etched pixel undesirably causes an OFF-defect.

To prevent the galvanic reaction, a width of the common voltage line taken perpendicular to an extension direction thereof is reduced so that the common voltage line is not exposed. However, when the width of the common voltage line is reduced, electrical resistance of the common voltage line is increased. Therefore, there remains a need for an improved display structure in which a galvanic reaction between materials of the data line and the pixel electrode is reduced or effectively prevented.

Hereinafter, the invention will be described in detail with reference to the accompanying drawings.

Next, an exemplary embodiment of an organic light emitting diode ("OLED") display according to the invention will be described with reference to FIG. 1 to FIG. 3.

Figure 2:
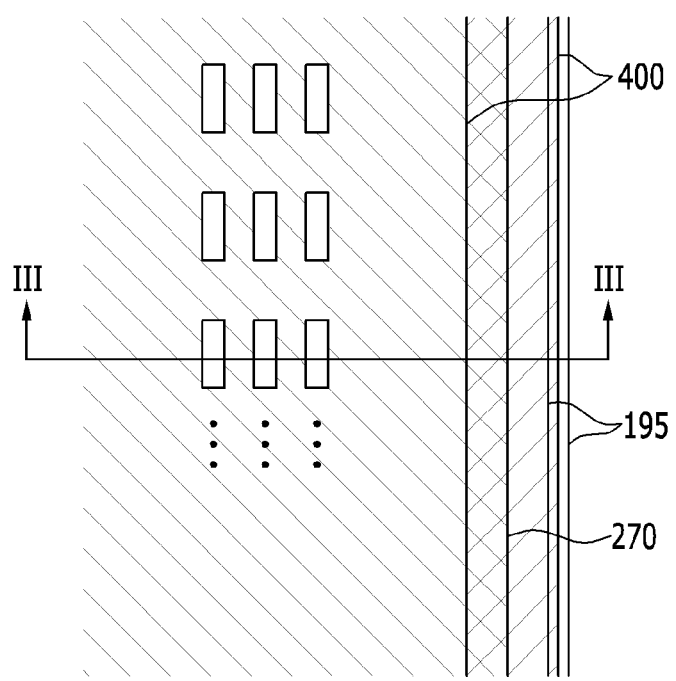
FIG. 2 is a top plan view of a portion A of FIG. 1.
Figure 3:
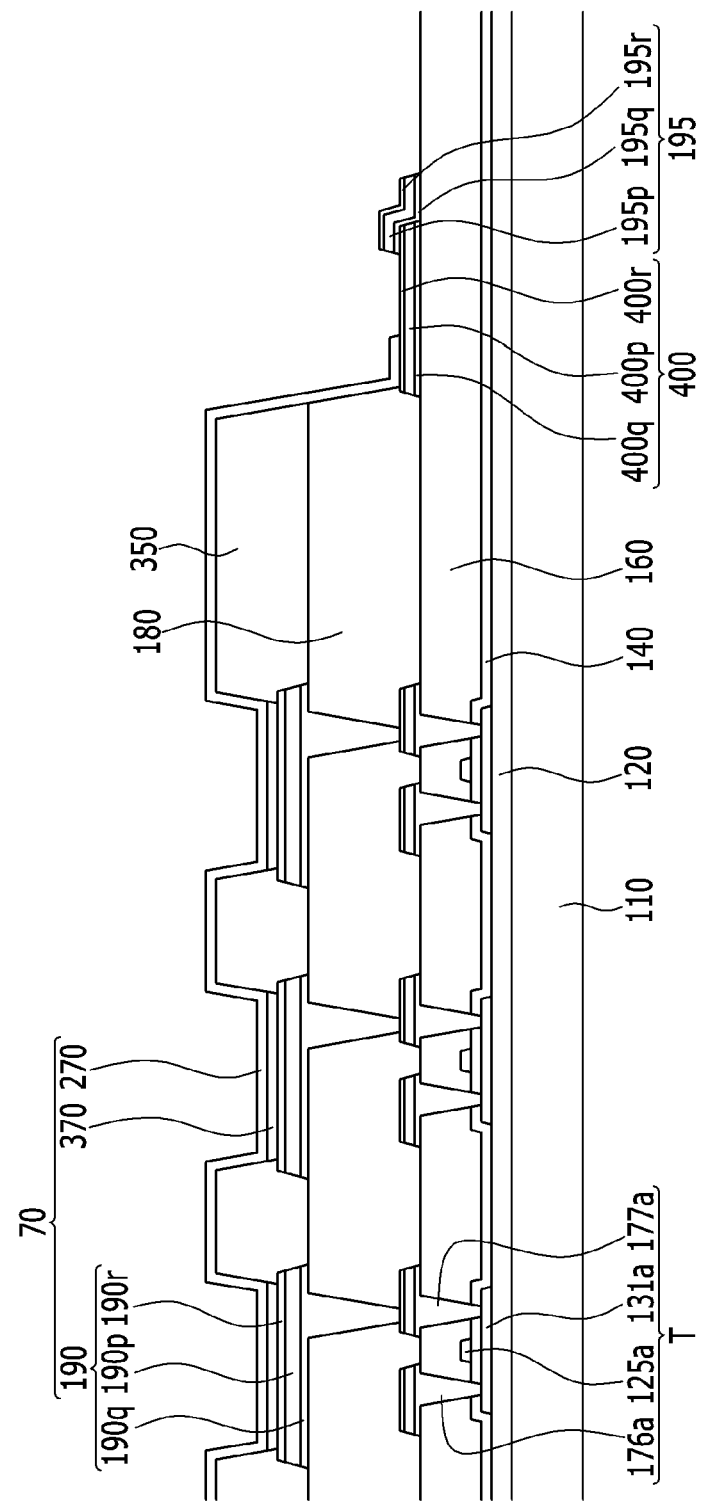
FIG. 3 is a cross-sectional view taken along line III-III of FIG. 2.

FIG. 1 is a top plan view of a pixel area and a peripheral area of an exemplary embodiment of an OLED display according to the invention, FIG. 2 is a top plan view of a portion A of FIG. 1, and FIG. 3 is a cross-sectional view taken along line III-III of FIG. 2.

As shown in FIG. 1 to FIG. 3, a substrate 110 of the OLED display is divided into a pixel area P, and a peripheral area S enclosing the pixel area P.

In the pixel area P of the substrate 110, a plurality of organic light emitting diodes ("OLEDs") 70 in a matrix type form is respectively connected between a scan line 121 transmitting a scan signal, a data line 171 transmitting a data signal and a driving voltage line 172 transmitting a driving voltage. As shown in FIG. 3, the OLED 70 includes a first electrode 190 as a pixel electrode and a second electrode 270 as a common electrode, and an organic emission layer 370 disposed between the first electrode 190 and the second electrode 270. The organic emission layer 370 may have a structure including a hole transport layer ("HTL"), an organic emission layer, and an electron transport layer ("ETL"). A hole injection layer ("HIL") and an electron injection layer ("EIL") may be further included in the organic emission layer 370 structure.

In the pixel area P of the substrate 110, a thin film transistor which controls an operation of the OLED 70 and a capacitor which maintains an applied signal, are further disposed. The thin film transistor includes a switching thin film transistor (not shown) and a driving thin film transistor T, and the driving thin film transistor T is connected to the first electrode 190.

The driving thin film transistor T includes a pixel semiconductor layer 131a, a pixel source electrode 176a, a pixel drain electrode 177a and a pixel gate electrode 125a. The pixel semiconductor layer 131a provides a source region, a drain region and a channel region of the driving thin film transistor TFT. The source region and the drain region of the pixel semiconductor layer 131a are connected to the pixel source electrode 176a and the pixel drain electrode 177a, respectively. The pixel gate electrode 125a insulated from the pixel semiconductor layer 131a by a gate insulating layer 140 is disposed on and overlapping the channel region.

In the peripheral area S of the substrate 110, a common voltage line 400 transmitting a common voltage to the second electrode 270 of the OLED 70, and a scan driver 600 and a data driver 700 processing signals provided from the outside and respectively supplying them to the scan line 121 and the data line 171, are disposed. The scan driver 700 and the data driver 600 convert the signals provided from the outside into the scan signal and the data signal to selectively drive each pixel in the pixel area P.

An exemplary embodiment of a layered structure of the OLED display according to the invention will be described with reference to FIG. 1 to FIG. 3.

As shown in FIG. 1 to FIG. 3, in the exemplary embodiment of the OLED display according to the invention, a buffer layer 120 is disposed in the pixel area P and the peripheral area S of the substrate 110, and the pixel semiconductor layer 131a is disposed on the buffer layer 120. The pixel semiconductor layer 131a disposed at the pixel area P provides an active layer of the driving thin film transistor T to drive the OLED 70.

The gate insulating layer 140 is disposed in the pixel area P including the semiconductor layer 131a and an entirety of the peripheral area S. The pixel gate electrode 125a is disposed on the gate insulating layer 140 on (e.g., overlapping) the semiconductor layer 131a.

An interlayer insulating layer 160 is disposed in the pixel area P including the pixel gate electrode 125a and the entirety of the peripheral area S. One or more contact hole exposing a predetermined portion of the semiconductor layer 131a is defined in the interlayer insulating layer 160 and the gate insulating layer 140. the pixel source electrode and the pixel drain electrode 176a and 177a are connected to the semiconductor layer 131a through the contact hole. The data line 171 connected to the source and drain electrodes 176a and 177a is disposed in the pixel area P, and the common voltage line 400 is disposed in the peripheral area S. The data line 171 and the pixel source and drain electrodes 176a and 177a may include a same material as each other, and be in a same layer of the OLED display.

The common voltage line 400 includes a main wire layer 400p, and assistance wire layers 400q and 400r respectively covering an upper side and a lower side of the main wire layer 400p. The main wire layer 400p may include aluminum (Al), and the assistance wire layers 400q and 400r may include titanium (Ti).

The common voltage line 400 may include a same material as the data line 171. That is, the data line 171, the pixel source electrode 176a and the pixel drain electrode 177a may include a main wire layer (not labeled), and assistance wire layers (not labeled) respectively covering an upper side and a lower side of the main wire layer.

A protective layer 180 is disposed on an entirety of the pixel area P and a portion of the peripheral area S. In an exemplary embodiment of manufacturing the OLED display, when a sealant (not shown) formed at an outermost portion of the peripheral area S and the protective layer 180 contact each other, the protective layer 180 may be damaged by a laser hardening process used to harden the sealant. Consequently, the protective layer 180 is only disposed at a portion of the peripheral area S and is not disposed at an outer portion of the peripheral area S.

In the protective layer 180 of the pixel area P, a via hole exposing a predetermined portion of the pixel drain electrode 177a is defined. Since the protective layer 180 is not disposed at an outermost portion of the peripheral area S, a predetermined portion of the common voltage line 400 is exposed. The pixel electrode 190 connected to the pixel drain electrode 177a through the via hole is disposed on the protective layer 180 in the pixel area P, and a reaction blocking part 195 covering a portion of the common voltage line 400 is disposed on the common voltage line 400 of the peripheral area S. The pixel electrode 190 may include a main wire layer 190p, and assistance wire layers 190q and 190r respectively covering an upper side and a lower side of the main wire layer 190p. The main wire layer 190p may include silver (Ag), and the assistance wire layers 190q and 190r may include a transparent conductive layer such as indium tin oxide ("ITO").

The common voltage line 400 and the pixel electrode 190 may include materials which cause a galvanic reaction in cooperation with an electrolyte. With reference to the materials described above, aluminum (Al) of the common voltage line 400 and silver (Ag) of the pixel electrode 190 are materials having a large standard reduction potential difference.

The reaction blocking part 195 includes a same material as the pixel electrode 190, and may include a main wire layer 195p, and assistance wire layers 195q and 195r respectively covering an upper side and a lower side of the main wire layer 195p. The main wire layer 195p may include silver (Ag), and the assistance wire layers 195q and 195r may include the transparent conductive layer such as ITO. The reaction blocking part 195 and the pixel electrode 190 may be considered in a same layer of the OLED display.

The reaction blocking part 195 covers a portion of the upper surface and the side surface of the common voltage line 400 such that the main wire layer 400p of the common voltage line 400 is not exposed.

That is, the assistance wire layer 400r is disposed at the upper surface of the main wire layer 400p of the common voltage line 400 such that the upper surface of the main wire layer 400p is not exposed to the outside, and the side surface of the main wire layer 400p of the common voltage line 400 is covered by the reaction blocking part 195 such that the side surface of the main wire layer 400p is not exposed to the outside.

As described above, by disposing the reaction blocking part 195 to prevent exposure of a main layer of the common voltage line 400 in the peripheral area S, main material layers of the common voltage line 400 and the pixel electrode 190 are blocked from each other during an etching process of the pixel electrode 190, such that the galvanic reaction may not be generated between the main material layers of the common voltage line 400 and the pixel electrode 190. Accordingly, corrosion of the pixel electrode 190 may be reduced or effectively prevented, thereby preventing a dark point defect of the pixel of the OLED display.

A pixel definition layer 350 is disposed on the entirety of the pixel area P. An opening exposing a partial region (a light emitting region) of the pixel electrode 190, is defined in the pixel definition layer 350. The organic emission layer 370 is disposed on the exposed region of the pixel electrode 190. The common electrode 270 connected to the common voltage line 400 is disposed on the pixel definition layer 350 at the pixel area P and the peripheral area S. Only a portion of the upper surface of the common voltage line 400 is covered by the reaction blocking part 195 such that the common electrode 270 contacts another portion of the upper surface of the common voltage line 400 and is disposed on the another portion of the upper surface of the common voltage line 400. Between the common electrode 270 and the reaction blocking part 195, a portion of the common voltage line 400 is exposed.

In the exemplary embodiment illustrated in FIG. 1 to FIG. 3, the reaction blocking part 195 covers the outer side surface and the portion of the upper surface of the common voltage line, however the reaction blocking part 195 may cover an entirety of the upper surface of the common voltage line, and the side surface, as a modified exemplary embodiment.

Figure 4:
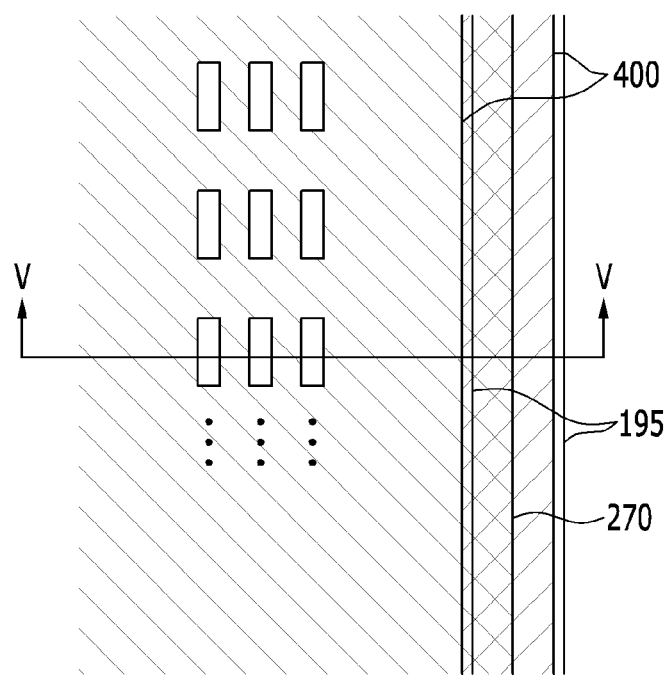
FIG. 4 is a top plan view of another exemplary embodiment of an OLED display according to the invention.
Figure 5:
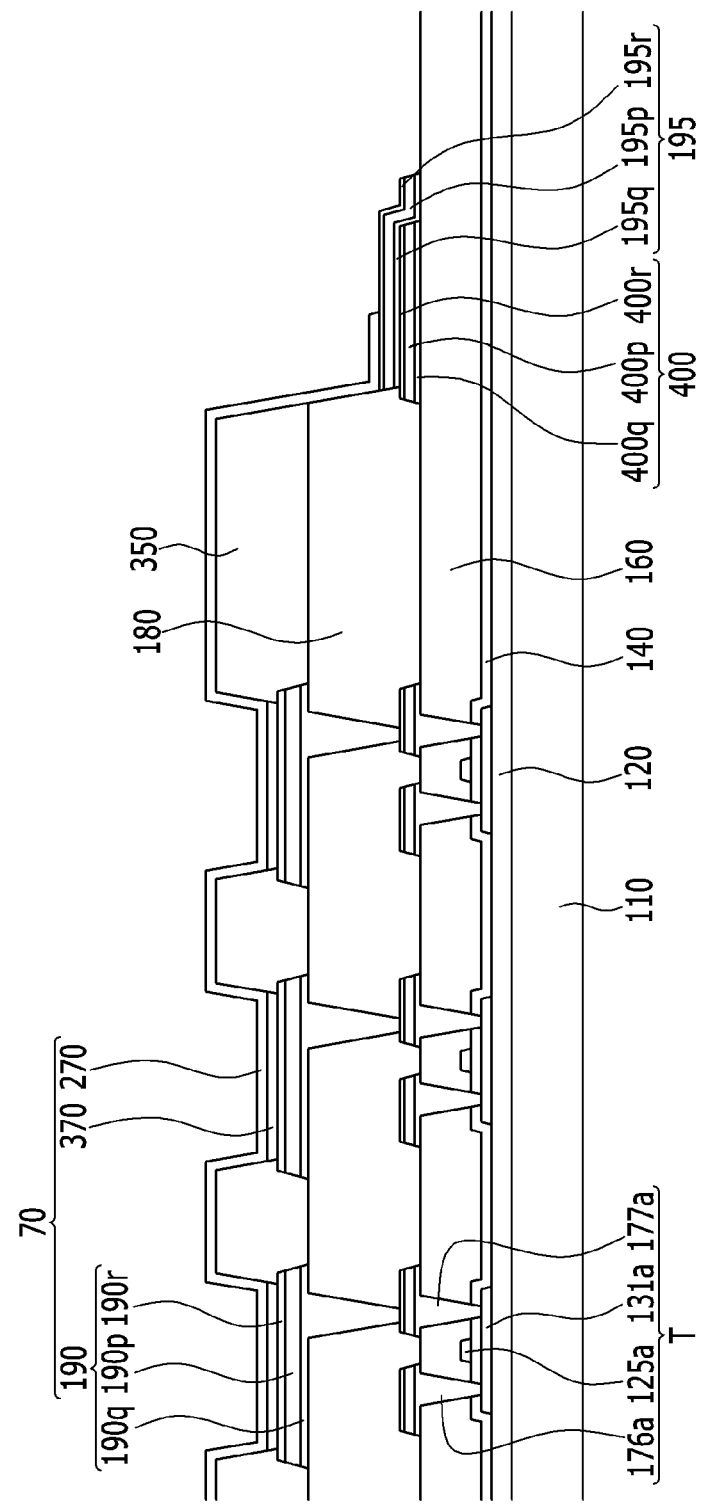
FIG. 5 is a cross-sectional view taken along line V-V of FIG. 4.

FIG. 4 is a top plan view of another exemplary embodiment of an OLED display according to the invention, and FIG. 5 is a cross-sectional view taken along line V-V of FIG. 4.

The exemplary embodiment shown in FIG. 4 and FIG. 5 is substantially equivalent to the exemplary embodiment shown in FIG. 1 to FIG. 3 except for a structure of the reaction blocking part.

As shown in FIG. 4 and FIG. 5, the via hole exposing the predetermined portion of the pixel drain electrode 177a is defined in the protective layer 180 in the pixel area P of the OLED display, and the protective layer 180 is not disposed at the outermost portion of the peripheral area S such that a predetermined portion of the common voltage line 400 is exposed by the protective layer 180. The pixel electrode 190 connected to the pixel drain electrode 177a through the via hole is disposed on the protective layer 180 in the pixel area P.

The reaction blocking part 195 covering an entirety of the side and upper surfaces of the common voltage line 400 is disposed on the common voltage line 400 in the peripheral area S. The reaction blocking part 195 includes a same material as the pixel electrode 190. The reaction blocking part 195 may include a main wire layer 195p, and assistance wire layers 195q and 195r covering the upper side and the lower side of the main wire layer 195p. The main wire layer 195p may include silver (Ag), and the assistance wire layers 195q and 195r may include the transparent conductive layer such as ITO.

The reaction blocking part 195 covers the entirety of the upper surface of the common voltage line 195 and the entirety of the side surface such that the main wire layer 400p of the common voltage line 400 is not exposed.

That is, the assistance wire layer 400r and the reaction blocking part 195 are deposited at the upper surface of the main wire layer 400p of the common voltage line 400, such that the upper surface of the main wire layer 400p is not exposed to the outside, and the side surface of the main wire layer 400p of the common voltage line 400 is covered by the reaction blocking part 195 such that the side surface of the main wire layer 400p is not exposed to the outside.

As described above, by disposing the reaction blocking part 195 to prevent exposure of a main layer of the common voltage line 400 in the peripheral area S, main material layers of the common voltage line 400 and the pixel electrode 190 are blocked from each other during an etching process of the pixel electrode 190. such that the galvanic reaction may not be generated between the main material layers of the common voltage line 400 and the pixel electrode 190. Accordingly, corrosion of the pixel electrode 190 may be reduced or effectively prevented, thereby preventing the dark point defect of the pixel of the OLED display.

The pixel definition layer 350 is disposed on the entirety of the pixel area P, and the opening exposing a partial region (a light emitting region) of the pixel electrode 190 is defined in the pixel definition layer 350. The organic emission layer 370 is disposed on the exposed region of the pixel electrode 190. The common electrode 270 connected to the common voltage line 400 is disposed on the pixel definition layer 350 at the pixel area P and the peripheral area S. The upper surface of the common voltage line 400 is covered by the reaction blocking part 195 such that the common electrode 270 is connected to the common voltage line 400 through the reaction blocking part 195.

In the exemplary embodiments illustrated in FIG. 1 to FIG. 5, the reaction blocking part includes a same material as the pixel electrode. However, in a modified exemplary embodiment, the reaction blocking part as a peripheral protective layer may cover the side surface and the portion of the upper surface of the common voltage line.

Figure 6:
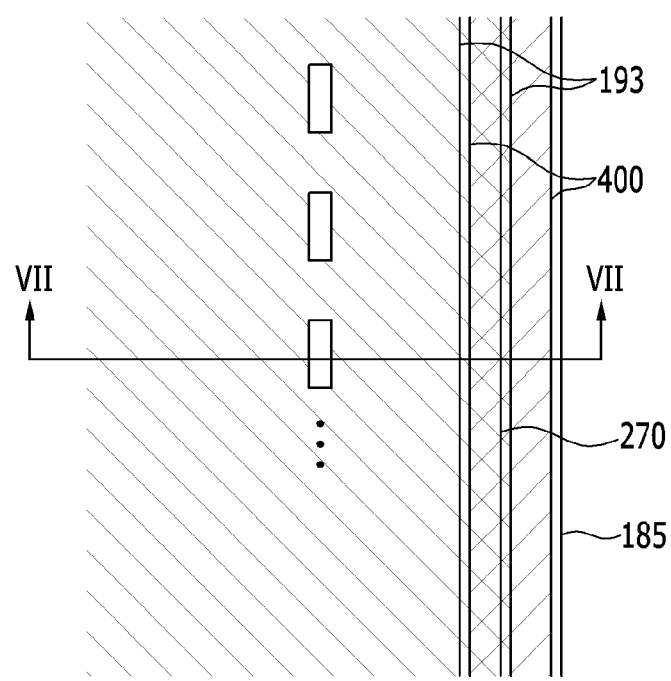
FIG. 6 is a top plan view of still another exemplary embodiment of an OLED display according to the invention.
Figure 7:
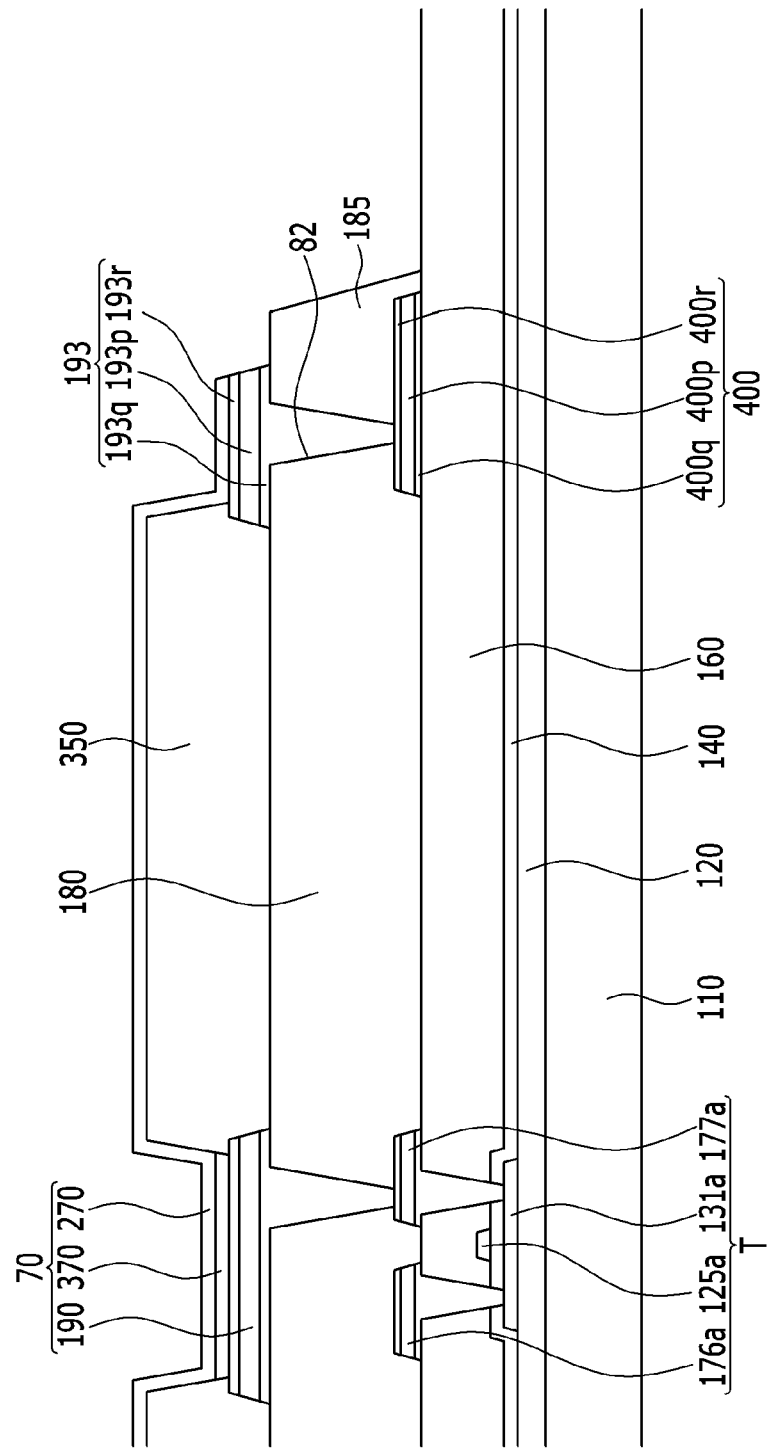
FIG. 7 is a cross-sectional view taken along line VII-VII of FIG. 6.

FIG. 6 is a top plan view of still another exemplary embodiment of an OLED display according to the invention, and FIG. 7 is a cross-sectional view taken along line VII-VII of FIG. 6.

The exemplary embodiment shown in FIG. 6 and FIG. 7 is substantially equivalent to the exemplary embodiment shown in FIG. 1 to FIG. 3 except for the structure of the reaction blocking part.

As shown in FIG. 6 and FIG. 7, the via hole exposing the predetermined portion of the pixel drain electrode 177a is defined in the protective layer 180 in the pixel area P of the OLED display according to the invention, a peripheral protective layer 185 as the reaction blocking part is disposed at the outer portion of the peripheral area S, and a connection hole 82 exposing a predetermined portion of the common voltage line 400 is defined in the peripheral protective layer 185. The pixel electrode 190 connected to the pixel drain electrode 177a is disposed on the protective layer 180 in the pixel area P, and a common connection member 193 connected to the common voltage line 400 through the connection hole 82 is disposed on the peripheral protective layer 185 in the peripheral area S. The peripheral protective layer 185 and the protective layer 180 may include a same material and be in a same layer of the OLED display.

The common connection member 193 includes a same material as the pixel electrode 190, and may includes a main wire layer 193p, and assistance wire layers 193q and 193r respectively covering an upper side and a lower side of the main wire layer 193p. The common connection member 193 and the pixel electrode 190 may be considered in a same layer of the OLED display.

The peripheral protective layer 185 covers the side surface and the portion of the upper surface of the common voltage line 400 such that the main wire layer 400p of the common voltage line 400 is not exposed to the outside.

That is, the assistance wire layer 400r and the peripheral protective layer 185 are deposited on the upper surface of the main wire layer 400p of the common voltage line 400 such that the upper surface of the main wire layer 400p is not exposed to the outside, and the side surface of the main wire layer 400p of the common voltage line 400 is covered by the peripheral protective layer 185 such that the side surface of the main wire layer 400p is not exposed to the outside.

As described above, by disposing the peripheral protective layer 185 to prevent exposure of a main layer of the common voltage line 400 in the peripheral area S, main material layers of the common voltage line 400 and the pixel electrode 190 are blocked from each other during an etching process of the pixel electrode 190, such that the galvanic reaction may not be generated between the main material layers of the common voltage line 400 and the pixel electrode 190. Accordingly, corrosion of the pixel electrode 190 may be reduced or effectively prevented, thereby preventing the dark point defect of the pixel of the OLED display.

The pixel definition layer 350 is disposed on the entirety of the pixel area P, and the opening posing a partial region (a light emitting region) of the pixel electrode 190 is defined in the pixel definition layer 350. The organic emission layer 370 is disposed on the exposed region of the pixel electrode 190. The common electrode 270 connected to the common voltage line 400 is disposed on the pixel definition layer 350 at the pixel area P and the peripheral area S. The upper surface of the common voltage line 400 is connected to the common electrode 270 through the common connection member 193.

While this invention has been described in connection with what is presently considered to be practical exemplary embodiments, it is to be understood that the invention is not limited to the disclosed exemplary embodiments, but, on the contrary, is intended to cover various modifications and equivalent arrangements included within the spirit and scope of the appended claims.

What is claimed is:

1. An organic light emitting diode display comprising:
   a substrate divided into a pixel area, and a peripheral area enclosing the pixel area;
   an organic light emitting diode which is in the pixel area, and comprises a first electrode, an organic emission layer and a second electrode;
   a common voltage line which is in the peripheral area and transmits a common voltage to the second electrode;
   an organic layer which is on the common voltage line, and comprises a contact hole in the peripheral area and at which the second electrode of the organic light emitting diode is connected to the common voltage line;
   a common connection member which is in the peripheral area and connects the second electrode of the organic light emitting diode to the common voltage line, the common connection member comprising:
      a main wire layer comprising an upper side and a lower side, and
      assistance wire layers respectively covering the upper side and the lower side of the main wire layer; and
   a pixel definition layer which is between the second electrode of the organic light emitting diode and the common connection member,
   wherein
   in the peripheral area, the second electrode overlaps the contact hole and contacts the common connection member, at a common area,
   at the common area, the common connection member fills an entirety of the contact hole, and
   an assistance wire layer of the common connection member which covers the lower side of the main wire layer fills the entirety of the contact hole.

2. The organic light emitting diode display of claim 1, further comprising:
   a scan line which is in the pixel area and transmits a scan signal; and
   a data line which is in the pixel area, intersects the scan line and transmits a data signal;
   wherein
   the organic layer covers the data line,
   the common voltage line is in a same layer and comprises a same material as the data line, and
   a portion of the common voltage line is exposed by the organic layer.

3. The organic light emitting diode display of claim 2, wherein
   the organic layer overlaps a side surface and a portion of an upper surface of the common voltage line, and
   the contact hole is defined in the portion of the organic layer in the peripheral area and exposes the portion of the common voltage line.

4. The organic light emitting diode display of claim 1, wherein the common connection member comprises a same material as the first electrode.

* * * * *